United States Patent
Lin et al.

(10) Patent No.: US 8,422,295 B1
(45) Date of Patent: Apr. 16, 2013

(54) NON-VOLATILE RANDOM ACCESS MEMORY COUPLED TO A FIRST, SECOND AND THIRD VOLTAGE AND OPERATION METHOD THEREOF

(75) Inventors: Chih-He Lin, Yunlin County (TW); Wen-Pin Lin, Changhua County (TW); Pi-Feng Chiu, New Taipei (TW); Shyh-Shyuan Sheu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/332,402

(22) Filed: Dec. 21, 2011

(30) Foreign Application Priority Data

Nov. 8, 2011 (TW) .............................. 100140703 A

(51) Int. Cl.
*G11C 14/00* (2006.01)
(52) U.S. Cl.
USPC ....... 365/185.08; 365/227; 365/229; 365/228
(58) Field of Classification Search ............ 365/185.08, 365/185.05, 227, 229, 228, 226
See application file for complete search history.

(56) References Cited

U.S. PATENT DOCUMENTS

| | | | |
|---|---|---|---|
| 7,206,217 B2 | 4/2007 | Ohtsuka et al. | |
| 7,321,505 B2 * | 1/2008 | Noda ............................ | 365/154 |
| 7,466,596 B2 * | 12/2008 | Ausserlechner et al. | 365/185.23 |
| 7,560,965 B2 | 7/2009 | Waldrip et al. | |
| 7,692,754 B2 | 4/2010 | Park et al. | |
| 7,760,538 B1 | 7/2010 | Paak | |
| 7,903,451 B2 | 3/2011 | Yamada et al. | |
| 2006/0181916 A1* | 8/2006 | Roehr ........................... | 365/148 |
| 2008/0225590 A1 | 9/2008 | Lamorey | |
| 2008/0229269 A1 | 9/2008 | Lamorey | |

FOREIGN PATENT DOCUMENTS

| | | |
|---|---|---|
| CN | 101246740 | 8/2008 |
| TW | 594757 | 6/2004 |

OTHER PUBLICATIONS

Shuu'ichirou Yamamoto et al., "Nonvolatile SRAM (NV-SRAM) Using Functional MOSFET Merged with Resistive Switching Devices", IEEE 2009 Custom Intergrated Circuits Conference (CICC), Issue Date: Sep. 13-16, 2009, pp. 531-534.
Pi-Feng Chiu et al., "A Low Store Energy, Low VDDmin, Nonvolatile 8T2R SRAM with 3D Stacked RRAM Devices for Low Power Mobile Applications", VLSI Circuits (VLSIC), 2010 IEEE Symposium on, Issue Date: Jun. 16-18, 2010 pp. 229-230.

(Continued)

*Primary Examiner* — Andrew Q Tran
(74) *Attorney, Agent, or Firm* — Jianq Chyun IP Office

(57) ABSTRACT

A non-volatile random access memory (NV-RAM) and an operation method thereof are provided. The NV-RAM includes a latch unit, a switch, and a first to fourth non-volatile memory elements. First terminals of the first and the third non-volatile memory elements respectively couple to a first voltage and a second voltage. A second terminal of the first non-volatile memory element and a first terminal of the second non-volatile memory element are coupled to a first terminal of the latch unit. A second terminal of the third non-volatile memory element and a first terminal of the fourth non-volatile memory element are coupled to a second terminal of the latch unit. Second terminals of the second and the fourth non-volatile memory element are coupled to a first terminal of the switch. A second terminal of the switch is coupled to a third voltage.

20 Claims, 7 Drawing Sheets

OTHER PUBLICATIONS

Shoichi Masui et al., "Design and Applications of Ferroelectric Nonvolatile S U M and Flip-Flop with Unlimited Readl Program Cycles and Stable Recall", IEEE 2003 Custom Integrated Circuits Conference, Issue Date: Sep. 21-24, 2003, pp. 403-406.

Wei Wang et al., "Nonvolatile SRAM Cell", Electron Devices Meeting, 2006. IEDM '06. International Issue Date: Dec. 11-13, 2006, pp. 1-4.

Tohru Miwa et al., "NV-SRAM: A Nonvolatile SRAM with Backup Ferroelectric Capacitors", IEEE Journal of Solid-State Circuits, vol. 36, No. 3, Mar. 2001, pp. 522-527.

Michael Fliesler et al., "A 15ns 4Mb NVSRAM in 0.13u SONOS Technology", Non-Volatile Semiconductor Memory Workshop, 2008 and 2008 International Conference on Memory Technology and Design. NVSMW/ICMTD 2008. Joint, Issue Date: May 18-22, 2008, pp. 83-86.

Noboru Sakimura et al., "Nonvolatile Magnetic Flip-Flop for Standby-Power-Free SoCs", IEEE Journal of Solid-State Circuits, vol. 44, No. 8, Aug. 2009, pp. 2244-2250.

Masashi Takata et al., "Nonvolatile SRAM based on Phase Change", Non-Volatile Semiconductor Memory Workshop, 2006. IEEE NVSMW 2006. 21st, Issue Date: Feb. 12-16, 2006, pp. 95-96.

\* cited by examiner

NON-VOLATILE RANDOM ACCESS MEMORY COUPLED TO A FIRST, SECOND AND THIRD VOLTAGE AND OPERATION METHOD THEREOF

CROSS-REFERENCE TO RELATED APPLICATION

This application claims the priority benefit of Taiwan application serial no. 100140703, filed on Nov. 8, 2011. The entirety of the above-mentioned patent application is hereby incorporated by reference herein and made a part of this specification.

BACKGROUND

1. Technical Field

The disclosure relates to a memory. Particularly, the disclosure relates to a non-volatile random access memory and an operation method thereof.

2. Related Art

With miniaturization of electronic products, integrated circuit (IC) miniaturization has become an important development trend of semiconductor technology. Therefore, the world's major semiconductor manufacturers have spent a lot on development of process miniaturization technology in order to integrate various digital logic circuits, memories and analog circuits into a single chip, so as to greatly improve a circuit operating speed and circuit functions, and reduce a product cost.

In a system on chip (SoC), a memory circuit occupies a large area, where the memory includes a latch, a flip-flop, and a circuit having an information memory function such as a static random access memory (SRAM), etc. For example, the SRAM is a volatile memory capable of being accessed in a high speed. When the chip enters a standby mode, in order to maintain stored data, the system has to keep providing power to the SRAM, and cannot cut off the power of the SRAM. Now, power consumption caused by a leakage current of the SRAM is considerable, which can be aggravated as memory capacity increases and along with process miniaturization. Conversely, in view of a non-volatile memory, the power of the non-volatile memory can be completely cut off in the standby mode to achieve zero power consumption. However, the non-volatile memories in the market cannot reach an operating speed of an RAM level.

Therefore, if the advantages of an RAM and the non-volatile memory are combined, the characteristic of the RAM is maintained. Moreover, the power of the system in the standby mode can be cut off to resolve the problem of power consumption caused by the leakage current of the RAM.

SUMMARY

The disclosure provides a non-volatile random access memory (NV-RAM) including a latch unit, a first non-volatile memory element, a second non-volatile memory element, a third non-volatile memory element, a fourth non-volatile memory element and a switch. The latch unit has a first terminal and a second terminal. A first terminal of the first non-volatile memory element is coupled to a first voltage, and a second terminal of the first non-volatile memory element is coupled to the first terminal of the latch unit. A first terminal of the second non-volatile memory element is coupled to the first terminal of the latch unit. A first terminal of the third non-volatile memory element is coupled to a second voltage, and a second terminal of the third non-volatile memory element is coupled to the second terminal of the latch unit. A first terminal of the fourth non-volatile memory element is coupled to the second terminal of the latch unit, and a second terminal of the fourth non-volatile memory element is coupled to a second terminal of the second non-volatile memory element. A first terminal of the switch is coupled to the second terminals of the second and the fourth non-volatile memory elements, and a second terminal of the switch is coupled to a third voltage.

The disclosure provides an operation method of a non-volatile random access memory, where the non-volatile random access memory is as that described above. The operation method includes following steps. When a standby mode is entered, a store procedure is performed. When the standby mode is ended, a recall procedure is performed. In the store procedure, the first voltage and the second voltage are set to high voltage levels, the third voltage is set to a low voltage level, and the switch is turned on. In the recall procedure, the first voltage and the second voltage are set to low voltage levels, the third voltage is set to a high voltage level, and the switch is turned on.

In order to make the aforementioned of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
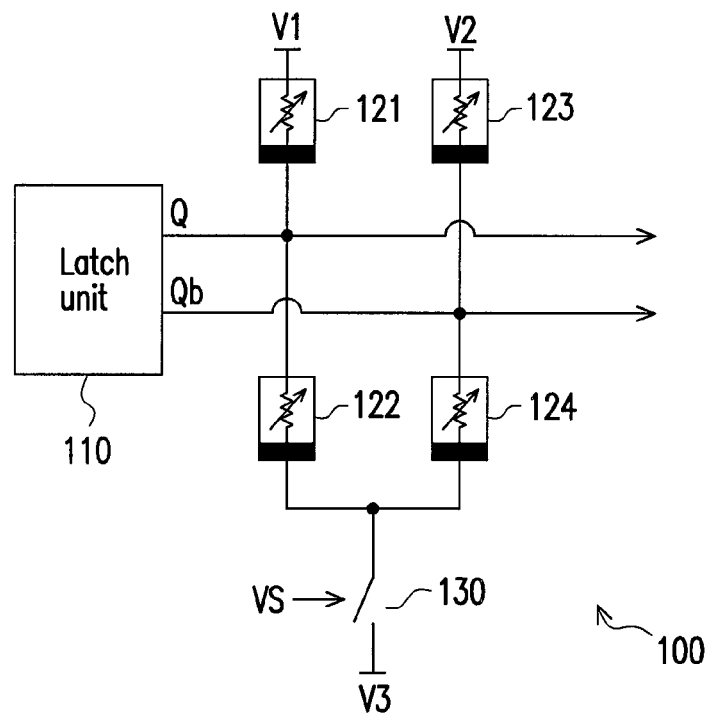
FIG. 1 is a functional block schematic diagram of a non-volatile random access memory (NV-RAM) according to an embodiment of the disclosure.

FIG. 1 is a functional block schematic diagram of a non-volatile random access memory (NV-RAM) 100 according to an embodiment of the disclosure. The NV-RAM 100 includes a latch unit 110, a first non-volatile memory element 121, a second non-volatile memory element 122, a third non-volatile memory element 123, a fourth non-volatile memory element 124 and a switch 130. The switch 130 can be a metal oxide semiconductor (MOS) transistor, a bipolar junction transistor (BJT), or a diode or can be implemented through other techniques. The switch 130 is turned on/off in response to a control voltage VS.

The latch unit 110 has a first terminal Q and a second terminal Qb. A first terminal of the first non-volatile memory element 121 is coupled to a first voltage V1, and a second terminal of the first non-volatile memory element 121 is coupled to the first terminal Q of the latch unit 110. A first terminal of the second non-volatile memory element 122 is coupled to the first terminal Q of the latch unit 110, and a second terminal of the second non-volatile memory element 122 is coupled to a first terminal of the switch 130. A first terminal of the third non-volatile memory element 123 is coupled to a second voltage V2, and a second terminal of the third non-volatile memory element 123 is coupled to the second terminal Qb of the latch unit 110. A first terminal of the fourth non-volatile memory element 124 is coupled to the second terminal Qb of the latch unit 110, and a second terminal of the fourth non-volatile memory element 124 is coupled to the second terminal of the second non-volatile memory element 122 and the first terminal of the switch 130. A second terminal of the switch 130 is coupled to a third voltage V3.

The first voltage V1, the second voltage V2 are provided by different voltage sources. In other embodiments, voltage levels of the first voltage V1 and the second voltage V2 respectively provided by different voltage sources are different. In the present embodiment, the voltage levels of the first voltage V1 and the second voltage V2 are the same.

The first non-volatile memory element 121, the second non-volatile memory element 122, the third non-volatile memory element 123 and the fourth non-volatile memory element 124 can be resistive memories, phase change memories (PCMs), or other non-volatile memories. For example, the first non-volatile memory element 121, the second non-volatile memory element 122, the third non-volatile memory element 123 and the fourth non-volatile memory element 124 respectively include a variable resistance element, where a top electrode and a bottom electrode of the variable resistance element respectively serve as the first terminal and the second terminal of the non-volatile memory element.

Those skilled in the art can implement the non-volatile memory elements 121-124 by any means according to a design requirement. For example, the non-volatile memory elements 121-124 are respectively formed by sequentially stacking a bottom electrode, a variable resistor and a top electrode on a substrate along a vertical direction. For example, a material of the bottom electrode deposited on a single crystal substrate of $LaALO_3$ (LAO) can be a $YBa_2Cu_3O_7$ (YBCO) film, a material of the variable resistor can be a crystalline $Pr_{1-x}Ca_xMnO_3$ (PCMO) film of perovskite-type oxide, and a terminal of the top electrode can be an Ag film deposited by sputtering. Moreover, regarding the material of the variable resistor, besides the above perovskite-type material, when a ZnSe—Ge heterostructure or a metal oxide of Ti, Nb, Hf, Zr, Ta, Ni, V, Zn, Sn, In, Th and Al, etc. is used, a resistance thereof is also variable as a voltage pulse applied on the top electrode and the bottom electrode thereof is changed. Based on different directions of the voltage applied on the top electrode and the bottom electrode, a resistance of the variable resistor can be reversibly changed. By reading the resistance of the variable resistor, an effect of the resistive memory is implemented.

It should be noticed that the stacking structure of the non-volatile memory elements 121-124 can be disposed on top of the substrate of an integrated circuit (IC), i.e. stacked on top of the latch unit 110 and the switch 130. Therefore, configuration of the non-volatile memory elements 121-124 does not increase additional chip area.

Figure 2:
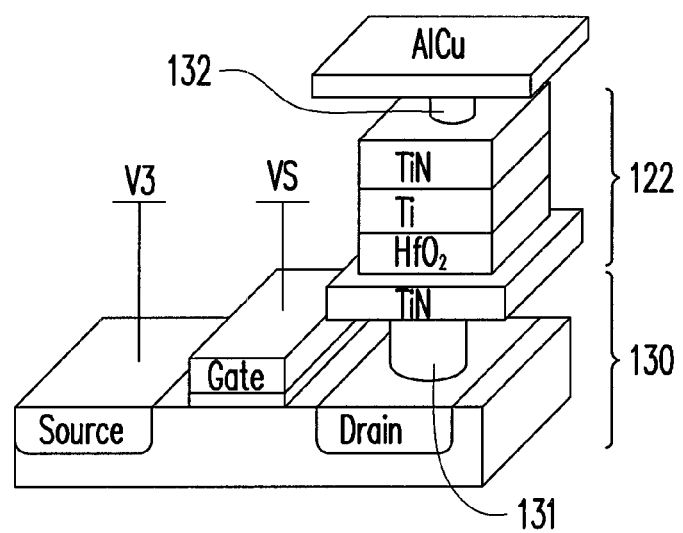
FIG. 2 is a three-dimensional view of a non-volatile memory element of FIG. 1 according to an embodiment of the disclosure.

In the present embodiment, the variable resistance elements are used to implement the non-volatile memory element 121-124. The second non-volatile memory element 122 is taken as an example for descriptions. FIG. 2 is a three-dimensional view of the second non-volatile memory element 122 of FIG. 1 according to an embodiment of the disclosure. Implementations of the other non-volatile memory elements 121, 123 and 124 can be deduced by referring to related descriptions of the second non-volatile memory element 122. The second non-volatile memory element 122 is disposed on top of the substrate of the IC. The second non-volatile memory element 122 is formed by sequentially stacking the bottom electrode, the variable resistor and the top electrode, so as to form a resistive memory element of a metal/resistor layer/metal (MIM) structure. The bottom electrode is electrically connected to the first terminal (for example, a drain of a transistor) of the switch 130 through a contact plug 131. In the present embodiment, a material of the bottom electrode is titanium nitride (TiN). In other embodiments, the bottom electrode is an oxide, nitride or nitrogen oxide of an element selected from manganese, iron, nickel, cobalt, titanium, copper, vanadium and silicon, for example, titanium (Ti), silicon dioxide ($SiO_2$), silicon (Si), etc. In the present embodiment, an atomic layer chemical vapor deposition method is used to plate a hafnium dioxide ($HfO_2$) film on top of the bottom electrode to form the aforementioned variable resistor. After the variable resistor is fabricated, titanium (Ti) and titanium nitride (TiN) are plated on the variable resistor to form the top electrode. The top electrode is electrically connected to the first terminal Q of the latch unit 110 and the second terminal of the first non-volatile memory element 121 through a via plug 132 and a metal interconnect. A material of the metal interconnect can be aluminium (Al), aluminium copper (AlCu) or other metals or conductive alloys.

In an initial stage of supplying power to the non-volatile memory elements 121-124, the NV-RAM 100 performs a forming procedure to initialise information of the non-volatile memory elements 121-124 to an initial state (for example, a low resistance state). In the forming procedure, the switch 130 is turned on, the first terminal Q and the second terminal Qb of the latch unit 110 are still in a non-ready state (for example, a floating state, or a high resistance state, etc.). The first voltage V1 and the second voltage V2 are set to high voltage levels in the forming procedure, and the third voltage V3 is set to a low voltage level in the forming procedure, so that a forming current flows from the top electrodes towards the bottom electrodes of the non-volatile memory elements 121-124. The forming current initialises states of the non-volatile memory elements 121-124 to the initial state (for example, the low resistance state).

Figure 3:
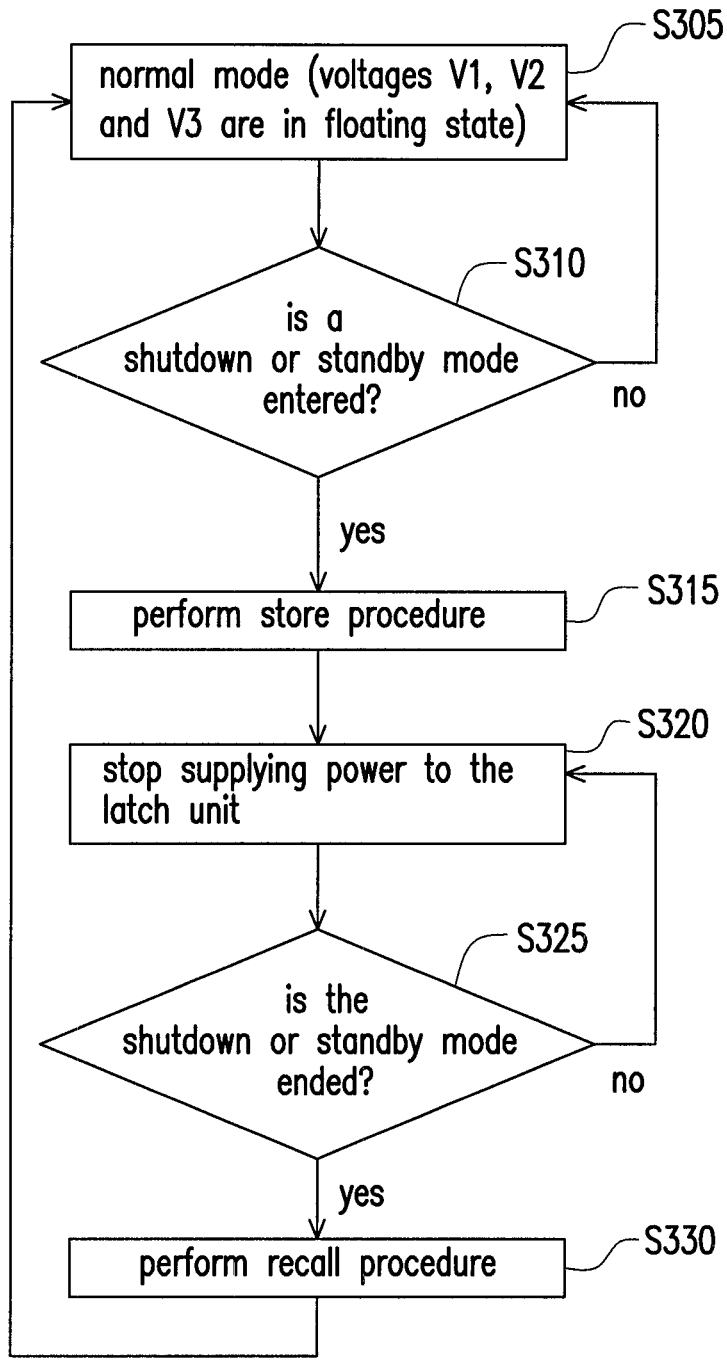
FIG. 3 is a flowchart illustrating an operation method of the NV-RAM of FIG. 1 according to an embodiment of the disclosure.

FIG. 3 is a flowchart illustrating an operation method of the NV-RAM 100 of FIG. 1 according to an embodiment of the disclosure. In a normal operation mode, the switch 130 is turned off, and the first voltage, V1, the second voltage V2 and the third voltage V3 are in a floating state (step S305), so that the non-volatile memory elements 121, 122, 123 and 124 do not influence a normal operation of the latch unit 110. In step S310, it is determined whether a standby mode is entered, for example, standby or shutdown, and when the standby or shutdown (power off) mode is entered, the NV-RAM 100 performs a store procedure (step S315) to record information of the latch unit 110 to the non-volatile memory elements 121-124.

In the store procedure, the switch 130 is turned on according to the control voltage VS, the first voltage V1 and the second voltage V2 are set to a high voltage level, and the third voltage V3 is set to a low voltage level. Actual voltage values of the high voltage level and the low voltage level are determined by materials/characteristics of the non-volatile memory elements 121-124. For example, the high voltage level is a system voltage VDD, and the low voltage level is a ground voltage. In the store procedure, information of the first terminal Q and the second terminal Qb of the latch unit 110 are recorded to the non-volatile memory elements 121-124. For example, before the store procedure is performed, if the first terminal Q and the second terminal Qb of the latch unit 110 are respectively logic 1 (for example, the high voltage level) and logic 0 (for example, the low voltage level), the state of the first non-volatile memory element 121 is set to the high resistance state, and the states of the other non-volatile memory elements 122-124 are set to the low resistance state. For another example, before the store procedure is performed, if the first terminal Q and the second terminal Qb of the latch unit 110 are respectively logic 0 and logic 1, the state of the third non-volatile memory element 123 is set to the high resistance state, and the states of the other non-volatile memory elements 121, 122 and 124 are set to the low resistance state.

After the store procedure is completed, it is stopped to supply power to the latch unit 110 (step S320) to resolve a problem of power consumption caused by a leakage current of the latch unit 110. Now, the NV-RAM 100 has entered the standby or shutdown state/mode. In step S325, it is kept determining whether the NV-RAM 100 ends the standby or shutdown state/mode. When the NV-RAM 100 ends the standby or shutdown state/mode, the NV-RAM 100 performs a recall procedure (step S330) to write back the information stored in the non-volatile memory elements 121-124 to the latch unit 100. In the recall procedure, the first terminal Q and the second terminal Qb of the latch unit 110 are still in the non-ready state (for example, the floating state, the high resistance state, or other unknown logic states, etc.). After the recall procedure is completed, the NV-RAM 100 is returned to the step S305 for normal operation.

In the recall procedure of the step S330, the first voltage V1 and the second voltage V2 are set to the low voltage level, the third voltage V3 is set to the high voltage level, and the switch S130 is turned on. For example, if the state of the first non-volatile memory element 121 is the high resistance state, and the states of the other non-volatile memory elements 122-124 are the low resistance state, the non-volatile memory element 121-124 may increase a voltage difference between the first terminal Q and the second terminal Qb of the latch unit 110, and a voltage of the first terminal Q is greater than a voltage of the second terminal Qb. Therefore, after the latch unit 110 is powered, the voltage of the first terminal Q is latched to the logic 1 (for example, the high voltage level), and the voltage of the second terminal Qb is latched to the logic 0 (for example, the low voltage level). For another example, if the state of the third non-volatile memory element 123 is the high resistance state, and the states of the other non-volatile memory elements 121, 122 and 124 are the low resistance state, the non-volatile memory element 121-124 may increase the voltage difference between the first terminal Q and the second terminal Qb of the latch unit 110, and the voltage of the first terminal Q is smaller than the voltage of the second terminal Qb. Therefore, after the latch unit 110 is powered, the voltage of the first terminal Q is latched to the logic 0, and the voltage of the second terminal Qb is latched to the logic 1.

After the recall procedure is completed, the NV-RAM 100 operates as a normal RAM, which can normally read and write the latch unit 110 without influencing a normal operation of the latch unit 110. Therefore, the NV-RAM 100 has both a characteristic of fast accessing speed of the RAM and an advantage of the non-volatile memory that maintains data after power-off.

Figure 4:
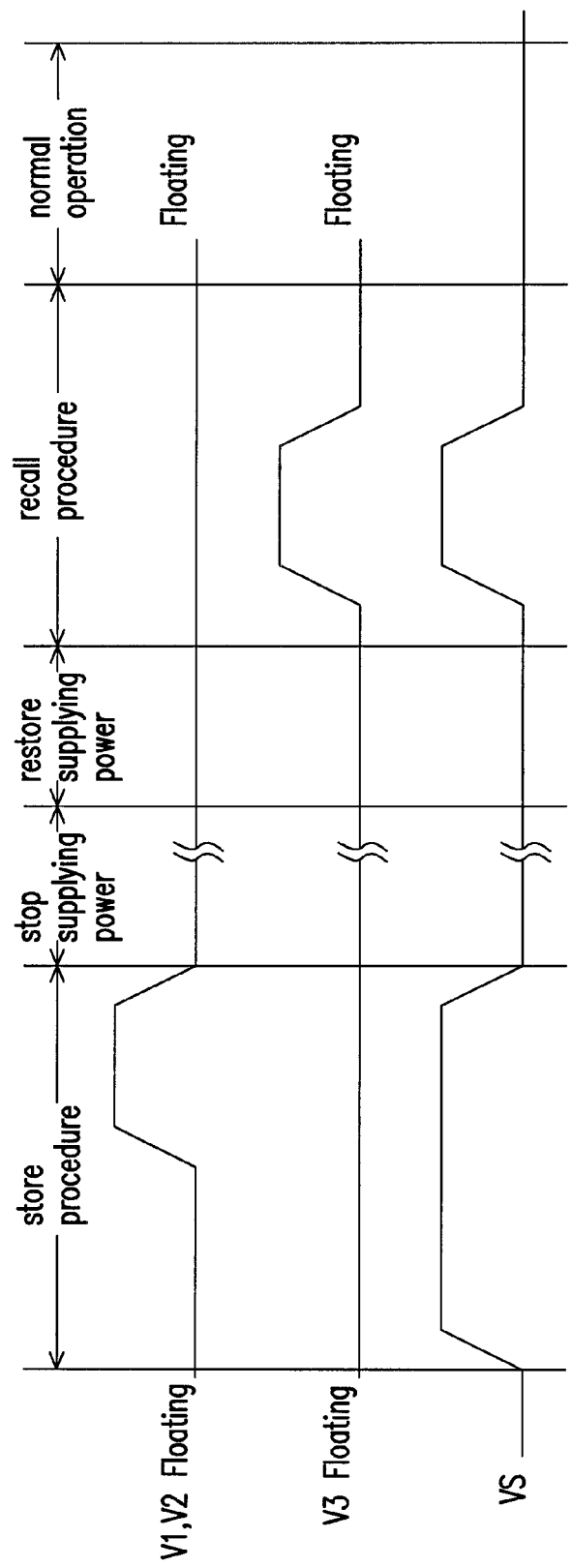
FIG. 4 is a signal timing diagram of the NV-RAM of FIG. 1 according to an embodiment of the disclosure.

FIG. 4 is a signal timing diagram of the NV-RAM 100 of FIG. 1 according to an embodiment of the disclosure. Referring to FIG. 1, FIG. 3 and FIG. 4, it is assumed that before the store procedure is performed, the first terminal Q and the second terminal Qb of the latch unit 110 are respectively logic 1 (for example, the high voltage level) and logic 0 (for example, the low voltage level). In a first period of the store procedure of the step S315, the first voltage V1, the second voltage V2 and the third voltage V3 are set to the low voltage level. Now, the high voltage level of the first terminal Q of the latch unit 110 provides a current flowing from the bottom electrode of the first non-volatile memory element 121 towards the top electrode of the first non-volatile memory element 121, so that the state of the first non-volatile memory element 121 is set to the high resistance state. The high voltage level of the first terminal Q of the latch unit 110 also provides a current flowing from the top electrode of the second non-volatile memory element 122 towards the bottom electrode of the second non-volatile memory element 122, so that the state of the second non-volatile memory element 122 is set to the low resistance state. The states of the non-volatile memory elements 123 and 124 are maintained to their original states (the low resistance state).

In a second period of the store procedure, the first voltage V1 and the second voltage V2 are set to the high voltage level, and the third voltage V3 is set to the low voltage level. Now, the high voltage level of the first terminal Q of the latch unit 110 provides a current flowing from the top electrode of the second non-volatile memory element 122 towards the bottom electrode of the second non-volatile memory element 122, so that the state of the second non-volatile memory element 122 is set to the low resistance state. A voltage difference between the second voltage V2 and the voltage of the second terminal Qb of the latch unit 110 provides a current flowing from the top electrode of the third non-volatile memory element 123 towards the bottom electrode of the third non-volatile memory element 123, so that the state of the third non-volatile memory element 123 is set to the low resistance state. The states of the non-volatile memory elements 121 and 124 are maintained to their original states (which are respectively the high resistance state and the low resistance state).

Referring to FIG. 4, in the recall procedure of the step S330, the first voltage V1 and the second voltage V2 are set to the low voltage level, and the third voltage V3 is set to the high voltage level. As described above, the state of the first non-volatile memory element 121 is the high resistance state, and the states of the non-volatile memory elements 122-124 are the low resistance state, so that the voltage of the first terminal Q is greater than the voltage of the second terminal Qb. Therefore, after the latch unit 110 is powered, the voltage of the first terminal Q is latched to the logic 1 (for example, the high voltage level), and the voltage of the second terminal Qb is latched to the logic 0 (for example, the low voltage level). Now, the non-volatile memory elements 121-124 have successfully written correct information back to the latch unit 110. After the recall procedure is ended to return to the normal operation mode, the switch 130 is turned off, and the first voltage V1, the second voltage V2 and the third voltage V3 are all set to the floating state. Therefore, although the state of the first non-volatile memory element 121 is maintained to the high resistance state in the normal operation mode, and the states of the other non-volatile memory elements 122-124 are maintained to the low resistance state, the non-volatile memory elements 121-124 do not influence the normal operation of the latch unit 110.

When the NV-RAM 100 again performs the store procedure, the floating states of the first voltage V1, the second voltage V2 and the third voltage V3 are ended. It is assumed that before the store procedure is performed, the first terminal Q and the second terminal Qb of the latch unit 110 are respectively logic 0 and logic 1. In the first period of the store procedure of the step S315, the voltage of the first terminal Q, the first voltage V1 and the third voltage V3 are all in the low voltage level, so that the non-volatile memory elements 121 and 122 are maintained to their original states (which are respectively the high resistance state and the low resistance state). The high voltage level of the second terminal Qb of the latch unit 110 provides a current flowing from the bottom electrode of the third non-volatile memory element 123 towards the top electrode of the third non-volatile memory element 123, so that the state of the third non-volatile memory element 123 is set to the high resistance state. The high voltage level of the second terminal Qb of the latch unit 110 also provides a current flowing from the top electrode of the fourth non-volatile memory element 124 towards the bottom electrode of the fourth non-volatile memory element 124, so that the state of the fourth non-volatile memory element 122 is set to the low resistance state.

In the second period of the store procedure, the first voltage V1 and the second voltage V2 are set to the high voltage level, and the third voltage V3 is set to the low voltage level. Now, a voltage difference between the first voltage V1 and the voltage of the first terminal Q of the latch unit 110 provides a current flowing from the top electrode of the first non-volatile memory element 121 towards the bottom electrode of the first non-volatile memory element 121, so that the state of the first non-volatile memory element 121 is set to the low resistance state. The states of the other non-volatile memory elements 122, 123 and 124 are maintained to their original states (which are respectively the low resistance state, the high resistance state and the low resistance state).

In the recall procedure of the step S330, the first voltage V1 and the second voltage V2 are set to the low voltage level, and the third voltage V3 is set to the high voltage level. As described above, the state of the third non-volatile memory element 123 is the high resistance state, and the states of the non-volatile memory elements 121, 122 and 124 are the low resistance state, so that the voltage of the first terminal Q is smaller than the voltage of the second terminal Qb. Therefore, after the latch unit 110 is powered, the voltage of the first terminal Q is latched to the logic 0, and the voltage of the second terminal Qb is latched to the logic 1. Now, the non-volatile memory elements 121-124 have successfully written correct information back to the latch unit 110.

Figure 5:
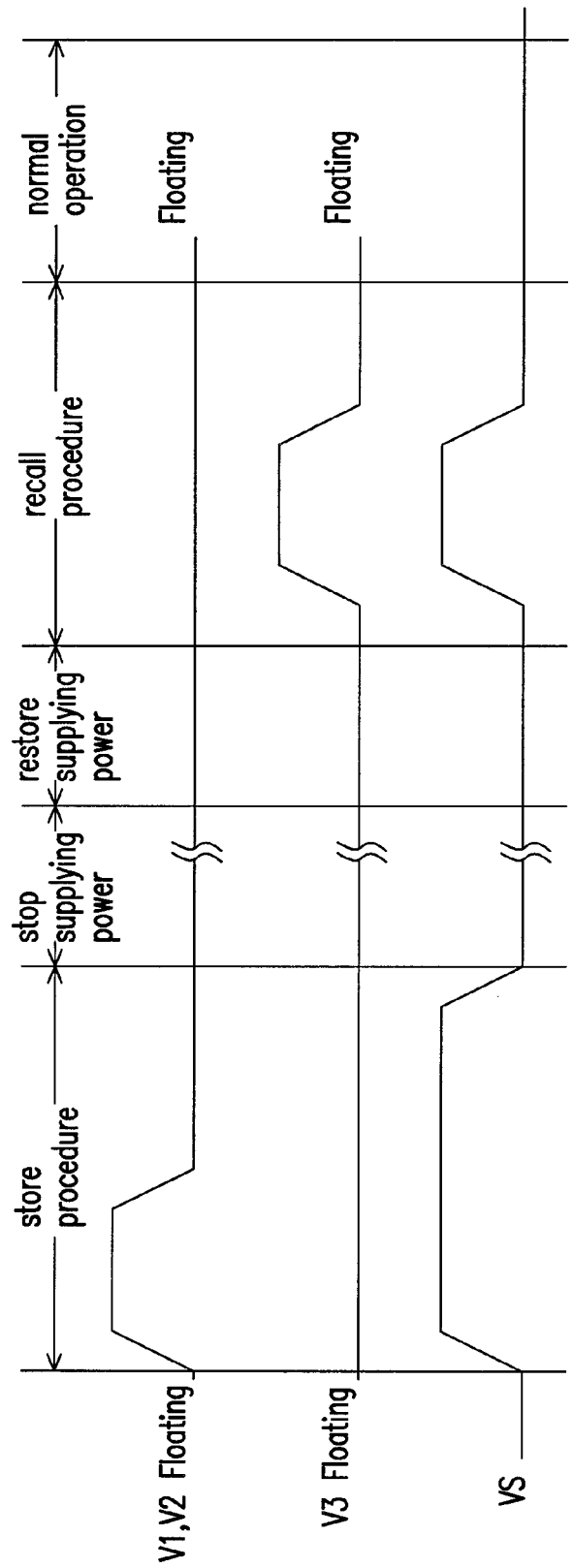
FIG. 5 is a signal timing diagram of the NV-RAM of FIG. 1 according to another embodiment of the disclosure.

FIG. 5 is a signal timing diagram of the NV-RAM 100 of FIG. 1 according to another embodiment of the disclosure. The embodiment of FIG. 5 can be deduced according to related descriptions of the embodiment of FIG. 4, so that details thereof are not repeated, and a difference there between is that in the embodiment of FIG. 5, in the first period of the store procedure, the first voltage V1 and the second voltage V2 are set to the high voltage level, and in the second period of the store procedure, the first voltage V1 and the second voltage V2 are set to the low voltage level.

Figure 6:
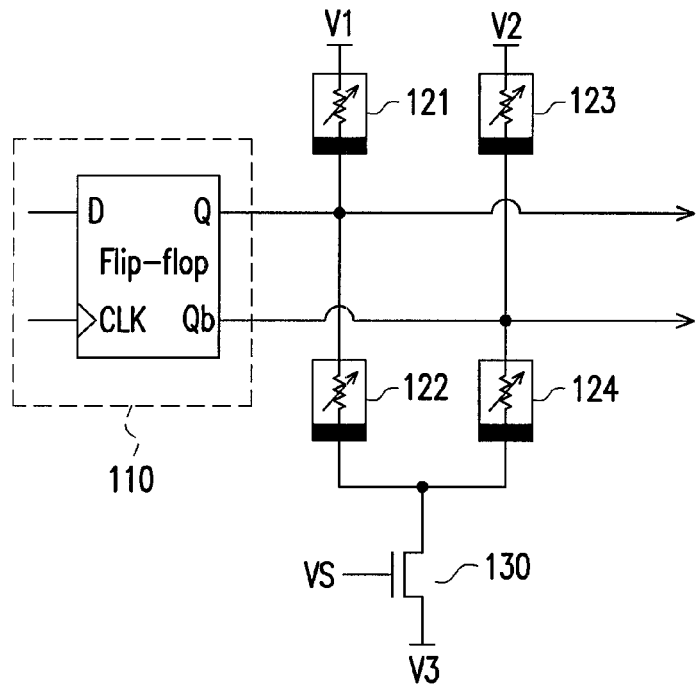
FIG. 6 is a circuit block schematic diagram of the NV-RAM of FIG. 1 according to an embodiment of the disclosure.

FIG. 6 is a circuit block schematic diagram of the NV-RAM 100 of FIG. 1 according to an embodiment of the disclosure. The embodiment of FIG. 6 can refer to related descriptions of the embodiments of FIG. 1 to FIG. 5. The latch unit 110 of the present embodiment includes a flip-flop, and a positive output terminal and an inverted output terminal of the flip-flop respectively serve as the first terminal Q and the second terminal Qb of the latch unit 110.

Figure 7:
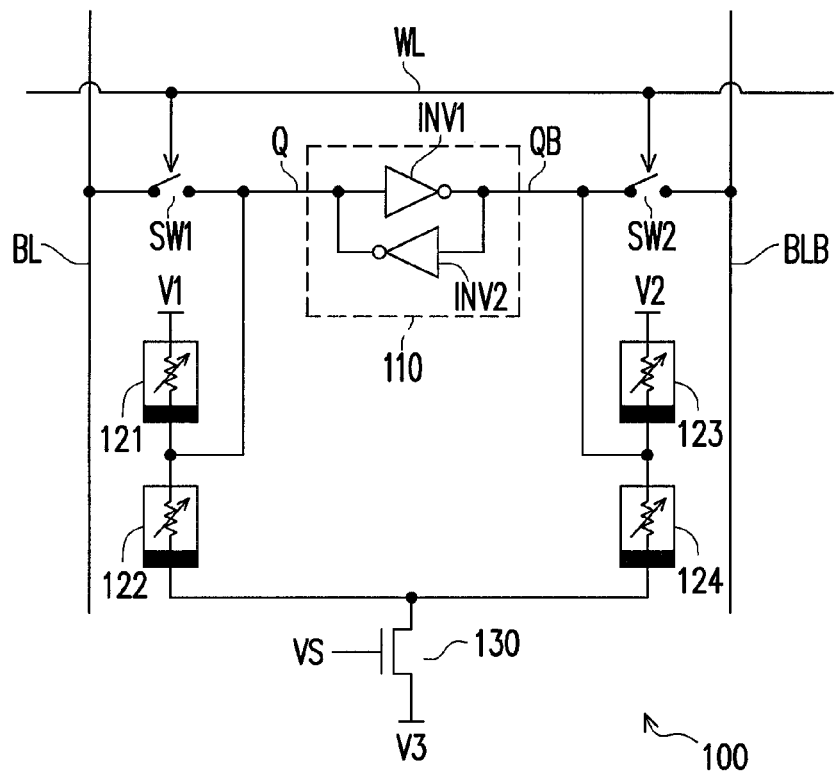
FIG. 7 is a circuit block schematic diagram of the NV-RAM of FIG. 1 according to another embodiment of the disclosure.

FIG. 7 is a circuit block schematic diagram of the NV-RAM 100 of FIG. 1 according to another embodiment of the disclosure. The embodiment of FIG. 7 can refer to related descriptions of the embodiments of FIG. 1 to FIG. 5. In the present embodiment, the NV-RAM 100 is applied to a static random access memory (SRAM). The NV-RAM 100 includes the latch unit 110, the non-volatile memory elements 121-124, a first switch SW1 and a second switch SW2. The latch unit 110 has a first NOT gate INV1 and a second NOT gate INV2. An input terminal of the first NOT gate INV1 serves as the first terminal Q of the latch unit 110. The input terminal of the first NOT gate INV1 is coupled to a first terminal of the first switch SW1 and an output terminal of the second NOT gate INV2. A second terminal of the first switch SW1 is connected to a first bit line BL. A control terminal of the first switch SW1 is connected to a word line WL.

An output terminal of the first NOT gate INV1 serves as the second terminal Qb of the latch unit 110. The output terminal of the first NOT gate INV1 is coupled to a first terminal of the second switch SW2 and an input terminal of the second NOT gate INV2. A second terminal of the second switch SW2 is connected to a second bit line BLB. A control terminal of the second switch SW2 is connected to the word line WL. The first switch SW1 and the second switch SW2 can be MOS transistors, BJTs, diodes or can be implemented through other techniques.

Figure 8:
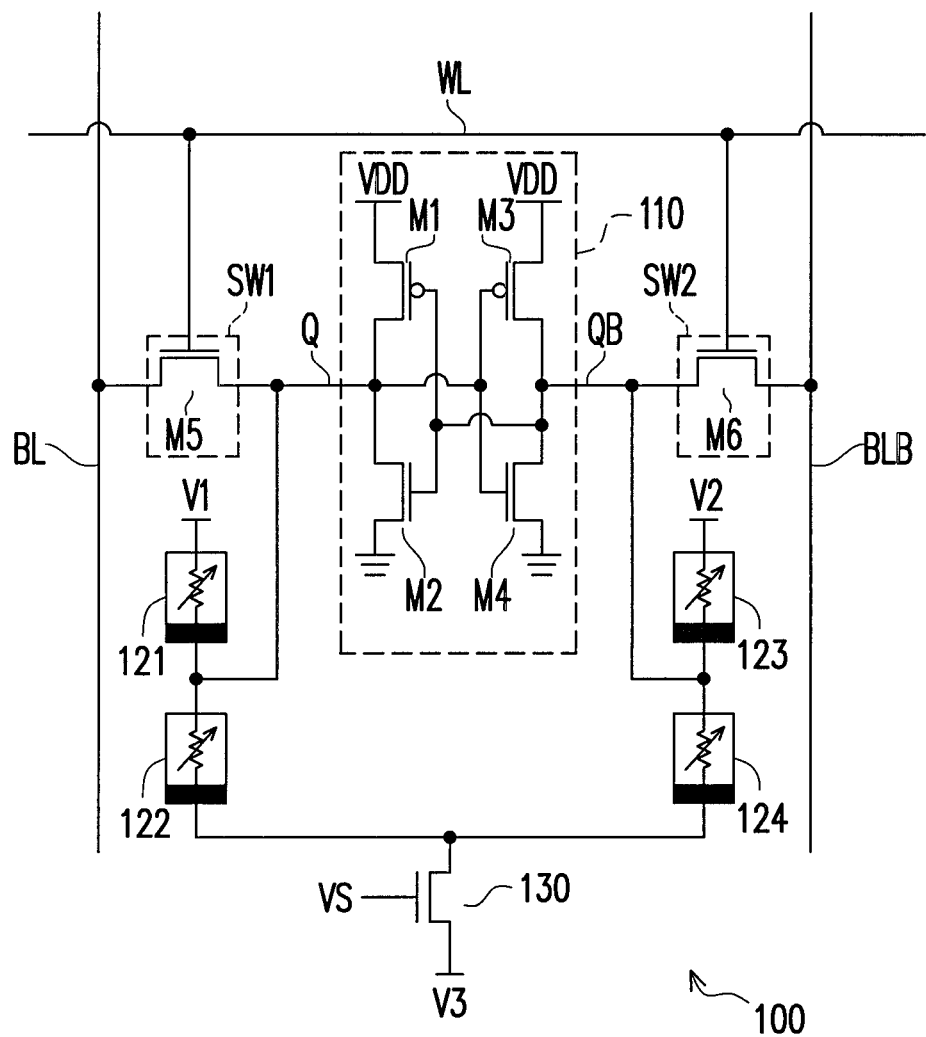
FIG. 8 is a circuit block schematic diagram of the NV-RAM of FIG. 1 according to still another embodiment of the disclosure.

FIG. 8 is a circuit block schematic diagram of the NV-RAM 100 of FIG. 1 according to still another embodiment of the disclosure. The embodiment of FIG. 8 can refer to related descriptions of the embodiments of FIG. 1 to FIG. 5 and FIG. 7. Referring to FIG. 8, the latch unit 110 includes a first transistor M1, a second transistor M2, a third transistor M3 and a fourth transistor M4. A first terminal (for example, a source) of the first transistor M1 is coupled to a fourth voltage (for example, the power voltage VDD). A second terminal (for example, a drain) of the first transistor M1 is connected to the first terminal Q of the latch unit 110. A control terminal (for example, a gate) of the first transistor M1 is connected to the second terminal Qb of the latch unit 110. A first terminal (for example, a source) of the second transistor M2 is coupled to a fifth voltage (for example, the ground voltage GND). A second terminal (for example, a drain) of the second transistor M2 is connected to the drain of the first transistor M1. A control terminal (for example, a gate) of the second transistor M2 is connected to the gate of the first transistor M1.

A first terminal (for example, a source) of the third transistor M3 is coupled to the power voltage VDD. A second terminal (for example, a drain) of the third transistor M3 is connected to the second terminal Qb of the latch unit 110. A control terminal (for example, a gate) of the third transistor M3 is connected to the first terminal Q of the latch unit 110. A first terminal (for example, a source) of the fourth transistor M4 is coupled to the ground voltage GND. A second terminal (for example, a drain) of the fourth transistor M4 is connected to the drain of the third transistor M3. A control terminal (for example, a gate) of the fourth transistor M4 is connected to the gate of the third transistor M3.

The first switch SW1 of FIG. 8 includes a fifth transistor M5. A first terminal of the fifth transistor M5 is connected to the first terminal Q of the latch unit 110. A second terminal of the fifth transistor M5 is connected to the first bit line BL. A control terminal of the fifth transistor M5 is connected to the word line WL. The second switch SW2 of FIG. 8 includes a sixth transistor M6. A first terminal of the sixth transistor M6 is connected to the second terminal Qb of the latch unit 110. A second terminal of the sixth transistor M6 is connected to the second bit line BLB. A control terminal of the sixth transistor M6 is connected to the word line WL. In the present embodiment, the fifth transistor M5 and the sixth transistor M6 are all N-channel metal oxide semiconductor (NMOS) transistors.

Figure 9:
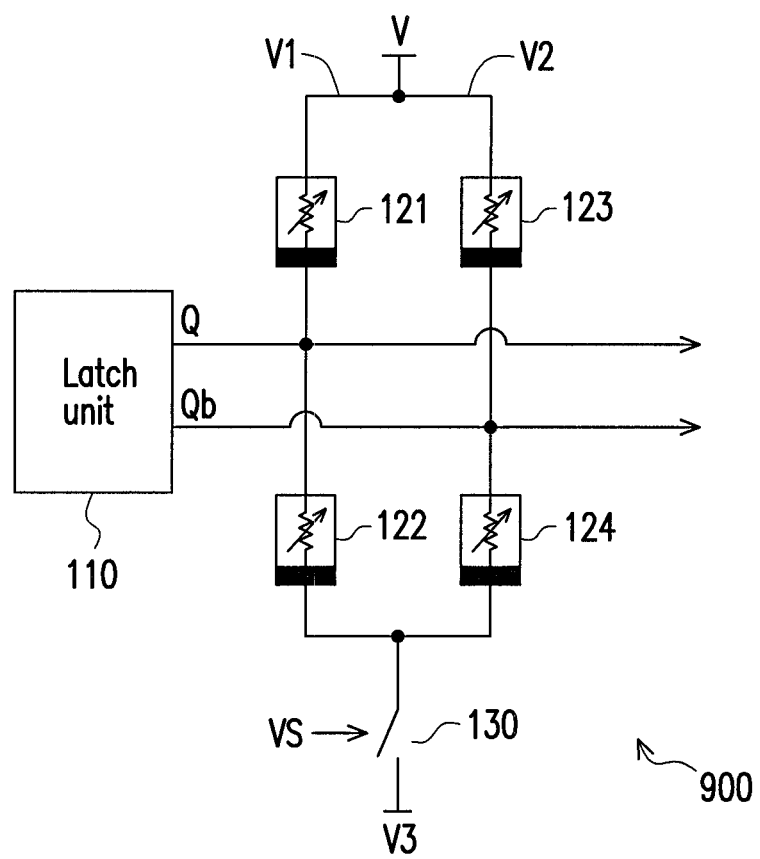
FIG. 9 is a functional block schematic diagram of a NV-RAM according to another embodiment of the disclosure.

FIG. 9 is a functional block schematic diagram of a NV-RAM 900 according to another embodiment of the disclosure. The embodiment of FIG. 9 can be deduced according to related descriptions of the embodiments of FIG. 1 to FIG. 8, so that details thereof are not repeated. A difference between the embodiment of FIG. 9 and the embodiment of FIG. 1 is that the first voltage V1 and the second voltage V2 in the embodiment of FIG. 1 are provided by different voltage sources, and the first voltage V1 and the second voltage V2 in the embodiment of FIG. 9 are provided by the same voltage source. For example, a system voltage source provides a power voltage V to the NV-RAM 900 to serve as the first voltage V1 and the second voltage V2.

In summary, the NV-RAM 100 of the disclosure combines the advantages of the SRAM and the non-volatile memory element. In a random read-write operation mode (the normal operation mode), the structure of the NV-RAM 100 has a characteristic of high accessing speed as that of the SRAM. When the NV-RAM 100 enters the standby mode, the NV-RAM 100 stores data into the non-volatile memory elements 121-124 in form of high and low resistances, and then cuts off the power voltage VDD without influencing data storage, so that the power consumption of the standby mode is zero. In the recall procedure, the voltages of the first terminal Q and the second terminal Qb of the latch unit 110 can be restored to the original states before the power voltage VDD is cut off according to different resistances of the non-volatile memory elements 121-124.

The disclosure is directed to a non-volatile random access memory (NV-RAM) and an operation method thereof, in which characteristics of a random access memory (RAM) and a non-volatile memory (NVM) are combined through a specific structure. Therefore, in a normal operation mode, the NV-RAM has an accessing characteristic of the RAM, and in a standby mode, power consumption thereof is reduced.

According to the above descriptions, the NV-RAM of the disclosure combines the latch unit and the non-volatile memory elements through a specific structure. In the normal operation mode, the switch is turned off, and the NV-RAM has a characteristic of high accessing speed as that of a general RAM. The store procedure is performed when the standby mode is entered, so as to record information of the latch unit to the non-volatile memory elements. The recall procedure is performed when the standby mode is ended, so as to write back the information recorded in the non-volatile memory elements to the latch unit. Therefore, the memory disclosed by the disclosure has an accessing characteristic of the RAM in the normal operation mode, and has an advantage of the non-volatile memory in the standby mode, so as to reduce the power consumption.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A non-volatile random access memory, comprising:
a latch unit, having a first terminal and a second terminal;
a first non-volatile memory element, having a first terminal coupled to a first voltage, and a second terminal coupled to the first terminal of the latch unit;
a second non-volatile memory element, having a first terminal coupled to the first terminal of the latch unit;
a third non-volatile memory element, having a first terminal coupled to a second voltage, and a second terminal coupled to the second terminal of the latch unit;
a fourth non-volatile memory element, having a first terminal coupled to the second terminal of the latch unit, and a second terminal coupled to a second terminal of the second non-volatile memory element; and
a switch, having a first terminal coupled to the second terminal of the second non-volatile memory element and the second terminal of the fourth non-volatile memory element, and a second terminal coupled to a third voltage.

2. The non-volatile random access memory as claimed in claim 1, wherein the latch unit comprises a flip-flop, wherein a positive output terminal and an inverted output terminal of the flip-flop respectively serve as the first terminal and the second terminal of the latch unit.

3. The non-volatile random access memory as claimed in claim 1, wherein the latch unit comprises:
a first NOT gate, having an input terminal serving as the first terminal of the latch unit, and an output terminal serving as the second terminal of the latch unit; and
a second NOT gate, having an input terminal coupled to the output terminal of the first NOT gate, and an output terminal coupled to the input terminal of the first NOT gate.

4. The non-volatile random access memory as claimed in claim 3, further comprising:
a first bit line;
a second bit line;
a word line;
a first switch, having a first terminal coupled to the input terminal of the first NOT gate, a second terminal coupled to the first bit line, and a control terminal coupled to the word line; and
a second switch, having a first terminal coupled to the output terminal of the first NOT gate, a second terminal coupled to the second bit line, and a control terminal coupled to the word line.

5. The non-volatile random access memory as claimed in claim 1, wherein the latch unit comprises:
a first transistor, having a first terminal coupled to a fourth voltage, a second terminal coupled to the first terminal of the latch unit, and a control terminal coupled to the second terminal of the latch unit;
a second transistor, having a first terminal coupled to a fifth voltage, a second terminal coupled to the second terminal of the first transistor, and a control terminal coupled to the control terminal of the first transistor;
a third transistor, having a first terminal coupled to the fourth voltage, a second terminal coupled to the second terminal of the latch unit, and a control terminal coupled to the first terminal of the latch unit; and
a fourth transistor, having a first terminal coupled to the fifth voltage, a second terminal coupled to the second terminal of the third transistor, and a control terminal coupled to the control terminal of the third transistor.

6. The non-volatile random access memory as claimed in claim 5, further comprising:

a first bit line;

a second bit line;

a word line;

a first switch, having a first terminal coupled to the first terminal of the latch unit, a second terminal coupled to the first bit line, and a control terminal coupled to the word line; and a second switch, having a first terminal coupled to the second terminal of the latch unit, a second terminal coupled to the second bit line, and a control terminal coupled to the word line.

7. The non-volatile random access memory as claimed in claim 1, wherein the first non-volatile memory element, the second non-volatile memory element, the third non-volatile memory element and the fourth non-volatile memory element respectively comprise a variable resistance element, wherein a top electrode and a bottom electrode of the variable resistance element respectively serve as the first terminal and the second terminal of the non-volatile memory element.

8. The non-volatile random access memory as claimed in claim 1, wherein the non-volatile random access memory performs a store procedure when a standby mode is entered; the non-volatile random access memory performs a recall procedure when the standby mode is ended; in the store procedure, the switch is turned on, the first voltage and the second voltage are high voltage levels, and the third voltage is a low voltage level; and in the recall procedure, the first voltage and the second voltage are low voltage levels, the third voltage is a high voltage level, and the switch is turned on.

9. The non-volatile random access memory as claimed in claim 8, wherein in a first period of the store procedure, the first voltage and the second voltage are the high voltage levels, and in a second period of the store procedure, the first voltage and the second voltage are the low voltage levels.

10. The non-volatile random access memory as claimed in claim 8, wherein after the store procedure is completed, power supplied to the latch unit is stopped.

11. The non-volatile random access memory as claimed in claim 8, wherein in a normal operation mode, the switch is turned off, and the first voltage, the second voltage and the third voltage are in a floating state.

12. The non-volatile random access memory as claimed in claim 1, wherein the first voltage and the second voltage are provided by a same voltage source.

13. The non-volatile random access memory as claimed in claim 1, wherein the first voltage and the second voltage are provided by different voltage sources.

14. The non-volatile random access memory as claimed in claim 13, wherein voltage levels of the first voltage and the second voltage are the same.

15. An operation method of a non-volatile random access memory, wherein the non-volatile random access memory is as claimed in claim 1, the operation method comprising:

performing a store procedure when a standby mode is entered;

performing a recall procedure when the standby mode is ended;

in the store procedure, setting the first voltage and the second voltage to high voltage levels, setting the third voltage to a low voltage level, and turning on the switch; and in the recall procedure, setting the first voltage and the second voltage to low voltage levels, setting the third voltage to a high voltage level, and turning on the switch.

16. The operation method of the non-volatile random access memory as claimed in claim 15, further comprising:

stopping supplying power to the latch unit after the store procedure is completed.

17. The operation method of the non-volatile random access memory as claimed in claim 15, further comprising:

in a normal operation mode, turning off the switch, and setting the first voltage, the second voltage and the third voltage to a floating state.

18. The operation method of the non-volatile random access memory as claimed in claim 15, wherein the first voltage and the second voltage are provided by a same voltage source.

19. The operation method of the non-volatile random access memory as claimed in claim 15, wherein the first voltage and the second voltage are provided by different voltage sources.

20. The operation method of the non-volatile random access memory as claimed in claim 19, wherein voltage levels of the first voltage and the second voltage are the same.

* * * * *